United States Patent [19]

Bluege et al.

[11] Patent Number: 4,814,232

[45] Date of Patent: Mar. 21, 1989

[54] METHOD FOR DEPOSITING LASER MIRROR COATINGS

[75] Inventors: John H. Bluege, Lake Park; Curtis A. Sudduth, N. Palm Beach, both of Fla.

[73] Assignee: United Technologies Corporation, Hartford, Conn.

[21] Appl. No.: 29,915

[22] Filed: Mar. 25, 1987

[51] Int. Cl.$^4$ .................................................. B32B 9/06
[52] U.S. Cl. ..................................... 428/450; 427/162; 427/163; 427/189; 427/190; 427/191; 427/205; 427/223; 427/225; 428/469; 428/912.2
[58] Field of Search ..................... 428/450, 469, 912.2; 427/162, 163, 189, 190, 191, 205, 223, 225

[56] References Cited

U.S. PATENT DOCUMENTS

| | | | |
|---|---|---|---|
| 4,101,707 | 7/1978 | Henry | 428/409 |
| 4,122,240 | 10/1978 | Banas et al. | 428/655 |
| 4,142,006 | 2/1979 | Choyke et al. | 427/162 |
| 4,444,467 | 4/1984 | Shuskus et al. | 350/310 |
| 4,451,119 | 5/1984 | Meyers et al. | 350/310 |
| 4,545,646 | 10/1985 | Chein et al. | 350/162.2 |

*Primary Examiner*—Marion C. McCamish
*Attorney, Agent, or Firm*—James M. Rashid

[57] ABSTRACT

Methods are described for making a mirror useful in reflecting high energy laser radiation. The mirrors are comprised of an intermediate coating layer applied to the mirror substrate and a reflective coating layer applied to the intermediate layer. Plasma spray techniques are used to apply a readily polishable intermediate coating layer at high deposition rates.

11 Claims, 2 Drawing Sheets

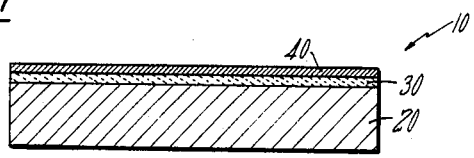

METHOD FOR DEPOSITING LASER MIRROR COATINGS

TECHNICAL FIELD

This invention relates to methods for making high energy laser mirrors. In particular, it relates to methods for depositing coatings on laser mirror substrates.

BACKGROUND

Mirrors used to reflect electromagnetic radiation are typically comprised of a reflective coating applied to a substrate which has been polished to a low roughness and a well defined surface figure. In some cases, however, it is difficult to achieve the required substrate surface conditions prior to the application of the reflective coating. The substrate may inherently have poor polishing characteristics or it simply may not be polishable to the level required to produce the necessary mirror properties. Even if the substrate is polishable to the required surface texture, the substrate material may be chemically or thermomechanically incompatible with the reflective coating which is applied to it, which complicates the fabrication of certain types of mirrors.

One technique that has been used in an attempt to alleviate such problems has been to apply an intermediate (buffer) layer between the substrate and the reflective layer. This intermediate layer is readily polishable, and provides the necessary transition characteristics between the substrate and the reflective layer. Mirrors having multiple coating layers (i.e., at least one intermediate layer and at least one reflective layer) are discussed in, for example, U.S. Pat. Nos. 4,101,707 to Henry, U.S. Pat. No. 4,142,006 to Choyke et al, 4,444,467 to Shuskus et al, and U.S. Pat. No. 4,451,119 to Meyers et al. These multiple coating layers are typically applied by techniques such as chemical vapor deposition (CVD), physical vapor deposition (PVD), or other material transport processes such as ion vapor deposition (IVD) and sputtering. While these processes are generally capable of depositing high quality coating layers, their deposition rates are relatively low and they are therefore costly to use. Depending on the size and shape of the substrate, and the coating composition which is applied thereto, it can take several hours to deposit the mirror coating to the required thickness. As mirror substrates become larger and more complex in shape, the time required to deposit and then polish the mirror coatings invariably increases.

Accordingly, what is needed is a more cost effective method for applying coatings to mirror substrates. These coatings should also be easy to polish. If these coating systems could be developed, such an improvement in the state of the art would reduce the time and cost of fabricating certain types of mirrors. It might also enable the fabrication of other mirrors which to date have not been fabricable.

SUMMARY OF THE INVENTION

This invention relates to a method for fabricating a mirror having a multilayered mirror coating system which comprises a reflective layer, and an intermediate layer between the reflective layer and the mirror substrate. The invention includes the steps of applying a thick intermediate coating layer onto the substrate surface by plasma spray techniques, and then either (a) polishing the intermediate layer and applying a reflective layer over it using conventional deposition techniques (CVD, PVD, IVD, etc.); (b) polishing the intermediate layer, applying an additional intermediate layer thereover which is then polished to even higher levels of smoothness, and then applying a reflective layer over this additional intermediate layer; or (c) densifying and smoothing the outer portion of the plasma sprayed intermediate layer with a high energy beam. The densified and smoothed intermediate layer may then be further polished using conventional techniques, followed by application of the reflective layer. Alternatively, the reflective layer may be applied immediately after beam treatment without additional polishing of the intermediate layer. Other process sequences for carrying out the invention are also possible, and are described in more detail below.

For the purposes of this specification and claims, the term "plasma spray" is intended to include all types of plasma and flame spray processes.

Application of a thick intermediate layer by plasma spray techniques, as opposed to the use of the conventional prior art vacuum deposition techniques discussed above, results in several improvements. First, the substrate to which the plasma sprayed layer is applied does not need to be polished to the same high degree of smoothness that is required when a thin intermediate layer is applied by conventional vacuum deposition techniques. Such thin vacuum deposited layers typically replicate the surface texture of the substrate; to achieve a smooth intermediate layer surface using prior art techniques, the substrate must be equally smooth.

A further advantage of this invention is that the deposition rate of plasma sprayed layers is measured in terms of microns per second, while the deposition rate of CVD, PVD, IVD, etc., layers is much slower, and measured in terms of microns per hour. Thus, the coating application time for mirrors made according to this invention is significantly reduced compared to mirrors made using prior art techniques.

Plasma sprayed layers may be applied such that their properties vary in a controlled manner as a function of thickness, to improve their compatibility with the substrate and with the reflective layer. For example, the density and/or composition of the plasma sprayed coating may be varied to closely match the thermal expansion coefficient of the substrate and the reflective layer.

The invention will be better understood by referring to the drawing and the description of the best mode for carrying out the invention, below.

BRIEF DESCRIPTION OF THE DRAWING

FIG. 1 is a simplified cross sectional view showing a mirror having a multilayered mirror coating.

FIGS. 2a-2b and 3a-3c are flow charts showing the steps for fabricating mirrors according to this invention.

BEST MODE FOR CARRYING OUT THE INVENTION

Figure 3A:
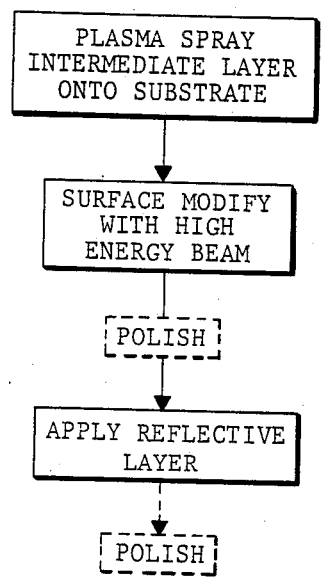

Referring to FIG. 1, a mirror 10 produced by the methods of this invention is shown as comprising a substrate 20, an intermediate layer 30, and a reflective layer 40. While FIG. 1 shows only two coating layers 30, 40, it should be understood that this invention is useful in fabricating mirrors having more than two such layers, i.e., more than one intermediate layer 30 and/or more than one reflective layer 40. The mirror produced according to this invention will be useful in reflecting laser radiation as well as other forms of electromagnetic radiation.

The preferred mirror substrate 20 includes materials such as molybdenum, tungsten, copper, silicon carbide, silicon nitride, carbon-carbon and glass-carbon composites. The substrates used in high power laser mirrors generally must have a low coefficient of thermal expansion, high thermal conductivity, and high modulus of elasticity. Materials other than those mentioned above may have this combination of properties, and will therefore be useful in the invention.

Unlike the intermediate coating layers of prior art mirrors, which layers are applied by conventional CVD, PVD, etc., techniques, the intermediate coating layer 30 of this invention is applied using plasma spray techniques. (As noted above, the term "plasma spray" is meant to describe plasma and flame spray processes.) During the plasma spray process, powder particles are heated by a plasma to a substantially (or completely) molten state, and the molten droplets are accelerated by the plasma and deposited onto the surface of the substrate 20. The droplets cool and solidify upon striking the surface of the substrate 20.

An advantage of using plasma spray techniques in the application of the intermediate layer 30 is the relatively high rate (typically at least about 10 microns per second) at which plasma sprayed layers can be deposited. The thickness of the intermediate layer for laser mirror applications will vary according to the particular operating requirements of the mirror; however, this thickness will generally vary in the range of about 10 to 200 microns. (It may be possible that thinner or thicker intermediate layers could be used.) Thus, it is seen that application of the intermediate layer according to this invention can be accomplished in a short time.

Another advantage of using plasma spray techniques to deposit the intermediate layer 30 according to this invention is that layers applied by such processing have microstructures and morphologies which are generally unaffected by the thickness of the layer or the surface texture of the substrate. Intermediate layers applied by conventional CVD, PVD, etc. techniques often suffer from defects which can exceed several microns in size, and which can degrade the properties of the layer.

Plasma spray techniques are capable of depositing a nearly fully dense coating layer of a broad composition range of materials to virtually any substrate. Materials which are readily plasma sprayed include pure metals, metal alloys, ceramics, and mixtures thereof. Typically, these materials are sprayed in powder form. Some useful intermediate layer materials include metals such as nickel, chromium, and silicon, and ceramics such as silica and silicon carbide.

In some cases, the plasma spray application of the intermediate layer 30 must be carried out in a vacuum or in an inert gas atmosphere to avoid oxidation or other chemical reaction of the heated (or molten) powder particles while they are being sprayed. In other cases, the powders must be sprayed in a reactive gas atmosphere in order to maintain compositional stoichiometry. When oxidation or an adverse reaction of the heated powders is not a concern, they may be sprayed in an air atmosphere.

It may be desired to produce an intermediate layer characterized by a composition which varies as a function of thickness. For example, the layer can be sprayed so that the composition is continuously graded or so that the concentration of one coating species increases in discrete amounts throughout the layer thickness. Such layers can be produced according to known plasma spray techniques. These types of graded (i.e., nonconstant composition) coatings may be applied to accommodate the application of a reflective layer which is not directly compatible with the substrate, or to produce a stress-free coating. Residual stresses in the coating may also be reduced by spraying the intermediate layer so that it contains a controlled amount of porosity, which amount may also be graded if graded mechanical properties are desired. The techniques to deposit these types of coatings are well known to those skilled in the art.

After the intermediate layer 30 has been plasma sprayed onto the substrate 20, further process steps are conducted in accordance with the flow charts shown in FIGS. 2a-2c and 3a-3c. In the Figures, solid boxes indicate necessary process steps and dotted boxes indicate optional process steps. Whether a step is necessary or optional is dictated by the anticipated use of the mirror.

As shown in FIG. 2a, after the application of the plasma sprayed intermediate layer, the layer is polished to a surface roughness and surface figure which is commensurate with the anticipated use of the mirror. Then, a reflective layer is applied over the polished, plasma sprayed intermediate layer using conventional techniques. The reflective layer may itself be polished if necessary to obtain the required reflective characteristics. FIG. 2a represents the preferred process sequence of the three processes defined in FIGS. 2a and 2b.

Mirrors made in accordance with the process steps shown in FIG. 2b are characterized by two or more intermediate layers, at least one of which is applied by plasma spraying. Preferably, it is the first intermediate layer which is applied by plasma spraying. Subsequent intermediate layer(s) are applied by conventional CVD, PVD, etc. techniques or also by plasma spraying. The layers are each polished as is required. After the last applied intermediate layer has been polished, the reflective layer is applied.

Figure 3B:
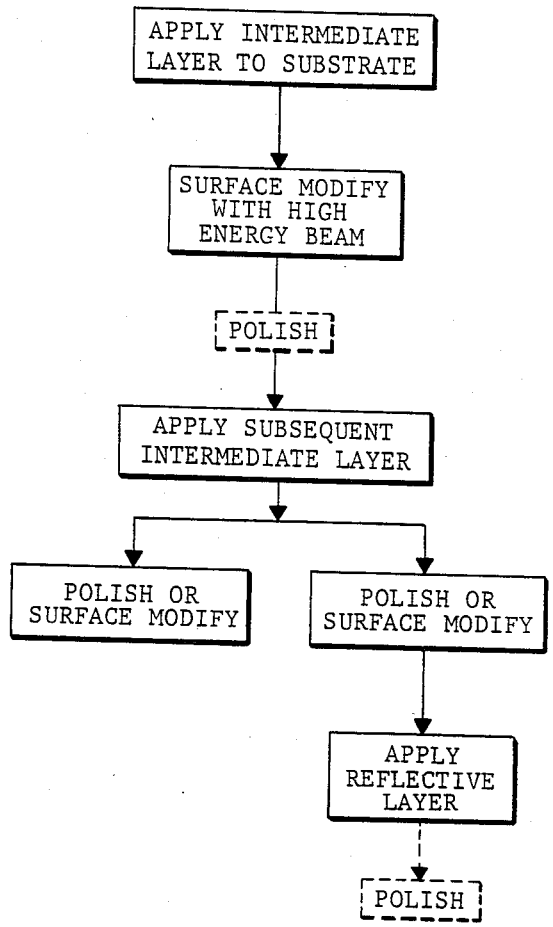
Figure 3C:
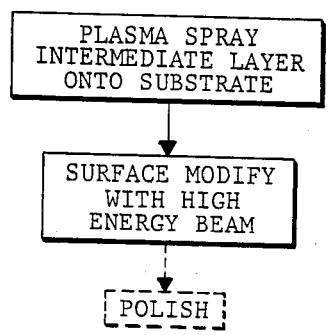

The intermediate layers of mirrors fabricated according to the process sequences shown in FIGS. 3a-3c are polished by a high energy beam, such as an electron or laser beam, as described in commonly assigned U.S. Pat. No. 4,122,402 to Banis et al, the contents of which are incorporated by reference. In such beam processing, the outer portion of the layer is partially or completely melted, resulting in densification and smoothing of the layer surface.

FIG. 3a shows the preferred mirror fabrication sequence when a high energy beam is used to treat the plasma sprayed intermediate layer. The particular beam treatment parameters will depend on the composition and thickness of the intermediate layer, and on the desired characteristics of the treated layer. These parameters can readily be determined by those skilled in the art. After the outer portion of the intermediate layer has been densified and smoothed by the high energy beam (and then conventionally polished, if necessary), the reflective layer is applied. Depending on the wavelength of the energy which will be reflected by the mirror during service use, a subsequent polishing of the reflective coating layer may be necessary.

FIG. 3b shows a process sequence which is similar to that described with reference to FIG. 2b. According to FIG. 3b, at least one of the intermediate layers is applied by plasma spraying, and at least one of the plasma sprayed layers is treated with a high energy beam. Following the deposition and polishing of the desired number of intermediate layers, the reflective layer is applied and polished. The mirror made in accordance with FIG. 3c is characterized by only one plasma sprayed intermediate layer which is treated with a high energy beam and further polished, if necessary. If the beam treated portion of the intermediate layer has the requisite reflective properties (such that no additional reflective layer need be applied) the treated portion of the intermediate layer is considered to be the reflective layer.

The following examples will illustrate the features of this invention. A 200 micron layer of pure silicon is plasma sprayed onto the surface of two unpolished mirror substrates. One substrate is molybdenum and the other a fiber reinforced glass ceramic composite. The pure silicon is sprayed in powder form; the powder particles have a typical size of about 10 microns, although the size of the powder is not considered to be critical. The silicon intermediate layer on each specimen is then conventionally polished to a smoothness level commensurate with the anticipated use of the mirror. Then a thin reflective layer of copper is applied to the surface of the silicon layer. The copper layer provides a highly reflective surface finish, and has particular utility in reflecting high power pulsed laser radiation. The copper layer is readily polished to about 10 angstroms, RMS.

From the foregoing description, one skilled in the art can easily ascertain the essential features of this invention and without departing from its scope or spirit, can make various changes and modifications of the invention to adapt it to various uses and conditions. For example, the intermediate coating layer may be applied by a wire spray process rather than by a powder spray process. Also, while vacuum deposition techniques (CVD, PVD, IVD, etc.) are preferred to apply the reflective layer, it may be possible to utilize electrolytic or electroless deposition techniques to apply the layer. Other variations may be made in the mirror fabrication process which will still be within the scope of the invention.

I claim:

1. A method for making a mirror comprising a substrate, an intermediate layer, and a reflective layer thereover, comprising the steps of generating a plasma stream of substantially nonreactive gases, and injecting powder particles into the stream such that the particles are plasma sprayed onto the substrate to form the intermediate layer; polishing the intermediate layer; and applying the reflective layer over the polished plasma sprayed intermediate layer.

2. The method of claim 1, wherein the intermediate layer is polished by mechanical or manual means.

3. The method of claim 1, wherein the intermediate layer is polished by melting and densifying the outer portion of the intermediate layer with a high energy beam.

4. The method of claim 1, wherein said step of spraying is performed to produce an intermediate layer having graded compositional or mechanical properties.

5. The method of claim 4, wherein said step of spraying is performed to produce a porous intermediate layer.

6. A method for making a laser mirror having a substrate, an intermediate layer, and a reflective layer thereover, wherein the improvement comprises generating a plasma stream of substantially nonreactive gases and injecting powder particles into the stream such that the particles are plasma sprayed onto the substrate to form a layer which is at least about 10 microns thick wherein said layer has substantially the same composition as the composition of the powder particles.

7. A laser mirror comprising a substrate, an intermediate layer over the substrate, and a reflective layer over the intermediate layer, wherein the intermediate layer is comprised of powder particles deposited onto the substrate by a process characterized by injecting said particles into a plasma stream of nonreactive gases, wherein said particles are heated in the stream and propelled by the stream onto the substrate surface where they cool and solidify.

8. The mirror of claim 7, wherein the intermediate layer has a graded composition.

9. The mirror of claim 8, wherein the intermediate layer has a graded oxide content.

10. The mirror of claim 7, wherein the intermediate layer is porous.

11. The mirror of claim 10, wherein the intermediate layer porosity is graded.

* * * * *